United States Patent
Oraw et al.

(10) Patent No.: US 9,368,549 B1
(45) Date of Patent: Jun. 14, 2016

(54) PRINTED MESH DEFINING PIXEL AREAS FOR PRINTED INORGANIC LED DIES

(71) Applicant: Nthdegree Technologies Worldwide Inc., Tempe, AZ (US)

(72) Inventors: Bradley S. Oraw, Chandler, AZ (US); Brian D. Ogonowsky, Mountain View, CA (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/843,818

(22) Filed: Sep. 2, 2015

(51) Int. Cl.
| | |
|---|---|
| *H01L 33/00* | (2010.01) |
| *H01L 27/15* | (2006.01) |
| *H01L 33/62* | (2010.01) |
| *H01L 33/60* | (2010.01) |
| *H01L 33/50* | (2010.01) |
| *H01L 33/48* | (2010.01) |
| *H01L 33/52* | (2010.01) |

(52) U.S. Cl.
CPC ............... *H01L 27/156* (2013.01); *H01L 33/00* (2013.01); *H01L 33/005* (2013.01); *H01L 33/486* (2013.01); *H01L 33/505* (2013.01); *H01L 33/52* (2013.01); *H01L 33/60* (2013.01); *H01L 33/62* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS

| 7,972,031 B2* | 7/2011 | Ray | G09F 9/33 174/261 |
|---|---|---|---|
| 8,133,768 B2* | 3/2012 | Ray | G09G 3/32 257/E21.006 |
| 8,889,216 B2* | 11/2014 | Ray | H01L 27/3281 427/66 |
| 9,074,758 B2* | 7/2015 | Oraw | H01L 25/0753 |
| 9,142,535 B2* | 9/2015 | Oraw | H01L 25/0756 |
| 9,281,298 B2* | 3/2016 | Ray | H01L 25/0753 |
| 2015/0054003 A1* | 2/2015 | Oraw | F21K 9/00 257/88 |

* cited by examiner

*Primary Examiner* — Minh-Loan Tran
(74) *Attorney, Agent, or Firm* — Patent Law Group LLP; Brian D. Ogonowsky

(57) ABSTRACT

Over a flexible substrate are formed column lines for a display. Over the substrate and column lines are formed a reflective hydrophobic mesh defining pixels. Over the mesh and column lines is printed an LED ink containing microscopic LED dies. The LED ink de-wets from the mesh. The ink is then cured to electrically connect the bottom electrodes of the LEDs to the column lines within the openings (cells) of the mesh. A dielectric then encapsulates the LEDs while exposing the top electrodes of the LEDs. Transparent row lines are then formed along the rows of the mesh to electrically contact the top electrodes in each row. The LEDs within any cell can be turned on by address in a pair of row and column lines. Phosphor dots may be printed to over blue-emitting LEDs to create red, green, and blue sub-pixels for a full color display.

17 Claims, 3 Drawing Sheets

PRINTED MESH DEFINING PIXEL AREAS FOR PRINTED INORGANIC LED DIES

FIELD OF THE INVENTION

This invention relates to addressable displays using printed microscopic light emitting diodes (LEDs) in each pixel location.

BACKGROUND

The present assignee has developed a printable LED light sheet where microscopic inorganic LED dies, having a top electrode and a bottom electrode, are printed as an ink on a conductive layer on a thin substrate. Such LEDs are called vertical LEDs. The ink comprises the LED dies uniformly infused in a solvent. After the ink is cured, the bottom electrodes of the LEDs make electrical contact to the conductive layer. A dielectric layer is then deposited between the LEDs, and another conductive layer is printed to make electrical contact to the top electrodes of the LEDs to connect the LEDs in parallel. A suitable voltage is applied to the two conductive layers to illuminate the LEDs. To allow light to escape, one or both of the conductive layers is transparent. Indium tin oxide (ITO) or sintered silver nano-wires may be used for the transparent conductive layer. Other conductive oxides may also be used. Such a technique is described in the assignee's US 2012/0164796, entitled, Method of Manufacturing a Printable Composition of a Liquid or Gel Suspension of Diodes, incorporated herein by reference.

One possible application of the light sheet technology is for addressable displays. However, since the printing process inherently prints the LEDs in a random pattern, there must be some means for printing separately addressable groups of LEDs. This may be done with screen printing, flexography, inkjet printing, or other printing method where the ink is dispensed as small, electrically isolated dots (pixels) over the substrate. However, it is difficult to form identical small pixels in this manner, and the deposited ink spreads somewhat. Further, when the groups of LEDs (pixels) are addressed and energized to create a lit pixel, the light spreads into adjacent pixel locations, reducing contrast and resolution.

What is needed is a technique for forming an addressable display using printed LEDs where pixels can be precisely formed and where there is reduced cross-talk between pixels.

SUMMARY

On a thin, flexible substrate are formed narrow, conductive column lines using a selective printing process, such as screen printing, flexography, inkjet printing, etc. Other ways may be used for form the column lines. The pitch of the column lines will be the pitch of the pixels. The column lines may be a reflective metal. In another embodiment, the substrate is reflective and the column lines are transparent.

Next, a substantially opaque, but reflective, mesh is printed over the substrate and column lines, such as a hydrophobic material containing reflective particles. The particles may be white, such as TiO2, or silver particles. The mesh has an array of openings (cells) that are aligned with the column lines so that the column lines are centered with respect to all the columns of cells. The cells form a two-dimensional array of pixel areas and may be formed precisely. The height of the mesh walls is approximately the height of the LEDs that will be printed. The LEDs may have a height on the order of 20 microns or less and a width of 50 microns or less. The cells may be square, hexagonal, or other shape. The hydrophobic material is selected to de-wet (repel) the LED ink solvent so that all the ink will reside within the cells. The mesh may be printed using inkjet printing, or other suitable technique, to precisely form the narrow pixel walls and achieve the desired height. Multiple LEDs will likely reside in each cell.

LED ink, comprising microscopic LED dies infused in a solvent, is then blanket printed over the mesh and cells, where the LEDs have a sufficient density in the ink so that at least one LED will reside in each cell. Since the mesh walls are hydrophobic, the LED ink does not reside on the tops of the walls but only resides within the cells.

The LED ink is then cured (solvent evaporated), which causes the bottom electrodes of the vertical LEDs to electrically contact the column lines at the bottom of each cell. The LED dies are shaped so that they have the proper orientation when in contact with the column lines. Such ink may be that described in the assignee's US 2012/0164796.

A transparent or translucent dielectric material is then deposited over the mesh and cells to encapsulate the sides of the LEDs. If the mesh is also hydrophobic to the dielectric material, the dielectric will only reside in the cells. If the dielectric covers the top electrodes of the LEDs, the dielectric may be blanket etched or holes may be formed in the dielectric to expose the top electrodes. The mesh may also be etched to have the desired height.

Transparent row lines, orthogonal to the column lines, are then printed over the mesh and cells to contact the exposed top electrodes in each row of cells (pixels). If the display is large and the resistivity of the transparent conductor material is problematic, narrow metal conductors may also be printed over the transparent row lines, such as above the mesh walls, so as not to block light from the pixels.

If the LED dies are GaN-based and emit blue light, red and green phosphors may be printed over the red and green pixel areas, respectively, so that the addressable pixels emit red, green, or blue light.

A controller controls the signals to the row and column lines so that only the LEDs at the intersection of energized row and column lines emit light. Even though the number of LEDs in each pixel may vary as a result of the printing process, the brightness of all the pixels will be substantially the same if the same current is applied to each pixel.

The reflective mesh not only precisely defines the pixels and keeps the LED light within the pixel area, but causes all the liquid LED ink to be deposited within the cells to form physically isolated areas of the LED ink. Therefore, the pixels can be made very small and defined by the mesh rather than being defined by the screen printing of the LED ink.

Using this technique, large, flexible high-definition color displays may be printed under atmospheric conditions using a roll-to-roll process.

Other embodiments are described.

BRIEF DESCRIPTION OF THE DRAWINGS

Elements that are similar or identical in the various figures are labeled with the same numeral.

DETAILED DESCRIPTION

Figure 1:
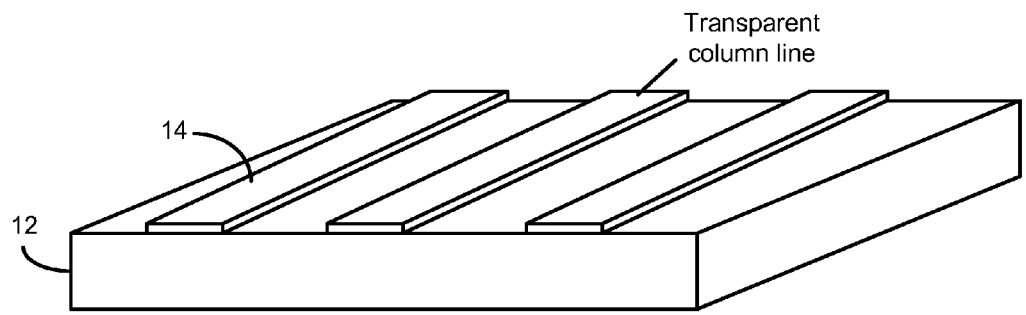
FIG. 1 is a perspective view of a flexible substrate having parallel conductive column lines formed over it.

In FIG. 1, a starting substrate 12 may be polycarbonate, PET (polyester), PMMA, Mylar, other type of polymer sheet, or other material. In one embodiment, the substrate 12 is about 12-250 microns thick. The size is approximately the desired size of the display.

Parallel, reflective metal column lines 14 are then deposited over the substrate 12, such as by screen printing, flexography, inkjet printing, or other printing. The substrate 12 may also be reflective. For enhancing flexibility, the column lines 14 may be a sintered silver nano-wire mesh. The terms column and row can be interchanged in this disclosure so that the row lines may be instead formed on the substrate 12. In one embodiment, the pitch of the column lines 14 is about 1 mm, so that the pixels are approximately 1×1 mm. Other size pixels are envisioned. The size of a pixel will depend on the size of the display and the desired resolution.

Figure 2:
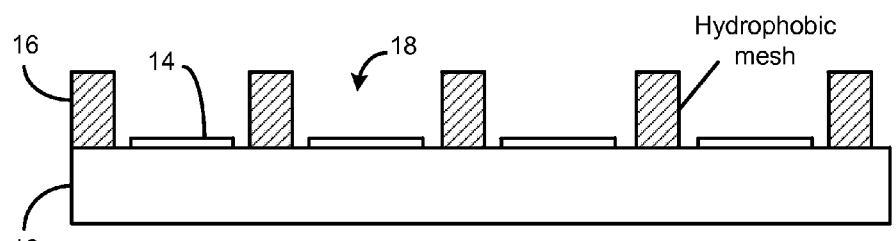
FIG. 2 is a cross-sectional view of the structure after a reflective mesh is printed so that the column lines are exposed within the cells of the mesh, where the mesh defines the pixels.

In FIG. 2, a hydrophobic material is printed over the substrate 12 and column lines 14 to form a mesh 16 having open cells 18. The hydrophobic material is such that the subsequently printed LED ink will de-wet off the material. In one embodiment, the material is silicone based. Many other types of materials can be used that are hydrophobic to the solvent in the LED ink. Various types of LED ink solvent (e.g., alcohol) may be used to optimize the hydrophobic properties. Such materials are well known.

Figure 3:
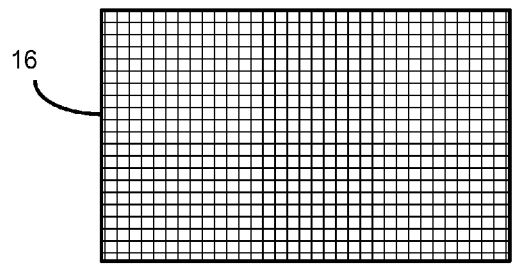
FIG. 3 is a front view of the structure showing the mesh and the open cells.

FIG. 3 is a front view of the printed mesh 16, having open cells that define the size of the pixels. In one embodiment, the pixels are square and range between 0.5 mm to 1 cm per side. The cells may be hexagonal, triangular, rectangular, or other shape.

The mesh 16 is approximately the height of the LEDs after the LED ink is printed and cured. In one embodiment, the height of the mesh is about 20 microns, depending on the height of the LEDs.

For a highly precise mesh 16 with very thin walls, inkjet printing can be used, although many other printing processes can be used, such as screen printing.

The mesh 16 is reflective by adding reflective particles, such as silver, $TiO_2$ (a white powder), or other suitable reflective material to a transparent binder, such as silicone.

Figure 4:
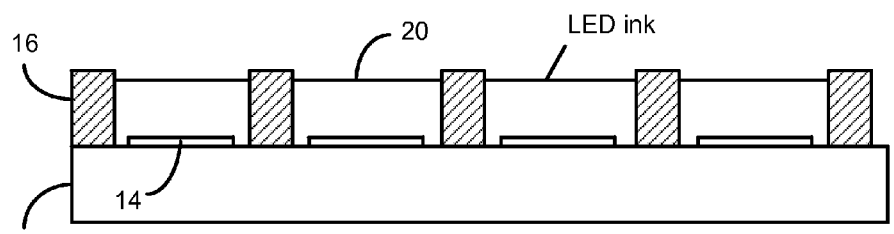
FIG. 4 illustrates the structure after LED ink is printed over the mesh and cells, where the ink de-wets off the top of the mesh.

In FIG. 4, the LED ink 20 is blanket printed, such as using screen printing, over the entire surface. The ink 20 is repelled off the top of the mesh 16, so all the ink 20 resides in the cells 18. The mesh 16 thus performs the function of a mold for the LED ink 20. Since the microscopic LEDs in the ink 20 are uniformly dispersed, there will be substantially equal numbers of LEDs in each cell. Slight variations will not affect the quality of the display since all pixels will have substantially the same brightness, even with different numbers of LEDs, if energized with the same current.

Figure 5:
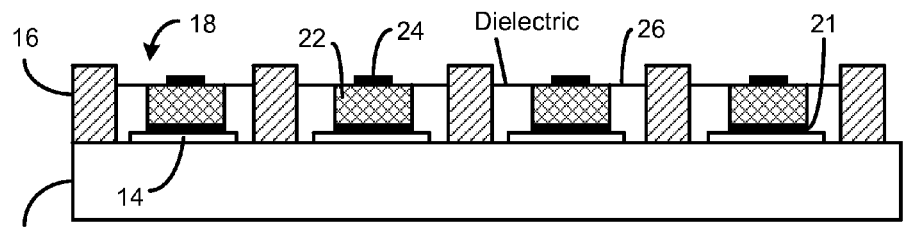
FIG. 5 illustrates a transparent or diffusive dielectric material encapsulating the sides of the LEDs after the LED ink is cured and the bottom electrodes of the LEDs electrically contact the column lines.

As shown in FIG. 5, the LED ink is then cured, such as by heating lamps, to evaporate the solvent and electrically connect the bottom electrodes 21 of the vertical LEDs 22 to the column lines 14. Although only one LED 22 is shown per cell 18 for simplicity, there may be any number of LEDs 22 per cell, and the number of LEDs 22 may differ slightly from cell to cell.

The cured LED ink results in a monolayer of microscopic inorganic LEDs 22 in each cell 18. The vertical LEDs 22 include standard semiconductor GaN layers, including an n-layer, and active layer, and a p-layer. GaN LEDs typically emit blue light. The LEDs 22, however, may be any type of LED and emit other than blue light, such as red, green, yellow, or other color light, including light outside the visible spectrum, such as the ultraviolet or infrared regions.

The GaN-based micro-LEDs 22 are less than a third the diameter of a human hair and less than a tenth as high, rendering them essentially invisible to the naked eye when the LEDs 22 are spread across the substrate 12. In one embodiment, the LEDs 22 have a diameter less than 50 microns and a height less than 20 microns. The number of micro-LED devices per unit area may be freely adjusted when applying the micro-LEDs to the substrate 12. Further detail of forming a light source by printing microscopic vertical LEDs, and controlling their orientation on a substrate, can be found in the assignee's US application publication US 2012/0164796.

In one embodiment, an LED wafer, containing many thousands of vertical LEDs, is fabricated so that the top metal electrode 24 for each LED 22 is small to allow light to exit the top surface of the LEDs 22. The bottom metal electrode 21 is reflective (a mirror) and should have a reflectivity of over 90% for visible light. In the example, the anode electrode is on top and the cathode electrode is on the bottom.

The LEDs 22 are completely formed on the wafer, including the anode and cathode metallizations, by using one or more carrier wafers during the processing and removing the growth substrate to gain access to both LED surfaces for metallization. The LED wafer is bonded to the carrier wafer using a dissolvable bonding adhesive. After the LEDs 22 are formed on the wafer, trenches are photolithographically defined and etched in the front surface of the wafer around each LED, to a depth equal to the bottom electrode, so that each LED 22 has a diameter of less than 50 microns and a thickness of about 4-20 microns, making them essentially invisible to the naked eye. A preferred shape of each LED is hexagonal. The trench etch exposes the underlying wafer bonding adhesive. The bonding adhesive is then dissolved in a solution to release the LEDs from the carrier wafer. Singulation may instead be performed by thinning the back surface of the wafer until the LEDs are singulated. The LEDs 22 of FIG. 5 result. The microscopic LEDs 22 are then uniformly infused in a solvent, including a viscosity-modifying polymer resin, to form an LED ink for printing.

The orientation of the printed LEDs 22 can be controlled by providing a relatively tall top electrode 24 (e.g., the anode electrode), so that the top electrode 24 orients upward by taking the fluid path of least resistance through the solvent after printing. By providing a heavier bottom electrode 21, the LEDs 22 also self-orient. The anode and cathode surfaces may be opposite to those shown. The locations of the LEDs 12 are random, but the approximate number of LEDs 12 printed per unit area can be controlled by the density of LEDs 12 in the ink.

After curing, the LEDs 22 remain attached to the underlying column line 14 with a small amount of residual resin that was dissolved in the LED ink as a viscosity modifier. The adhesive properties of the resin and the decrease in volume of resin underneath the LEDs 22 during curing press the bottom electrode 21 against the underlying column line 14, creating a good electrical connection. Over 90% like orientation has been achieved.

Also in FIG. 5, a transparent or translucent polymer dielectric layer 26 is then printed over the surface to encapsulate the sides of the LEDs 22 and further secure them in position. The ink used to form the dielectric layer 26 pulls back from the upper surface of the LEDs 22, or de-wets from the top of the LEDs 22, during curing to expose the top electrodes 24. If any dielectric remains over the LEDs 22, a blanket etch step may be performed to expose the top electrodes 24. The dielectric also de-wets off the mesh 16 since the mesh 16 is hydrophobic with respect to the dielectric material. Many different types of well known, printable dielectric materials may be used. The dielectric layer 26 is then cured.

Figure 6:
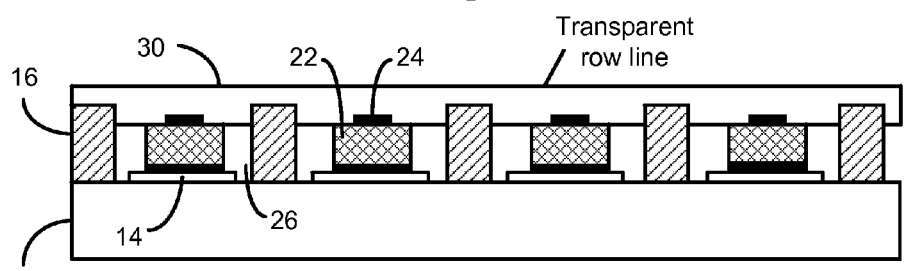
FIG. 6 illustrates a transparent row line electrically contacting top electrodes of the LEDs in a single row.

As shown in FIG. 6, parallel, transparent row lines 30 are then printed along the rows of cells (pixels) to electrically contact the top electrodes 24 in each row. The row lines 30 may be ITO, a sintered silver nano-wire mesh, or other transparent conductor. The row lines 30 are then cured. The row lines and column lines may be interchanged.

In one embodiment, the display is a large high-definition display with 720 (row)×1080 (column) full color pixels. Since each full color pixel contains at least red, green, and blue sub-pixels, there must be sufficient row and column lines to address these sub-pixels. In one embodiment, there is a common row line for all three sub-pixels in a single full color pixel and a separate column line for each of the sub-pixels to enable each sub-pixel to be separately addressed.

Figure 7:
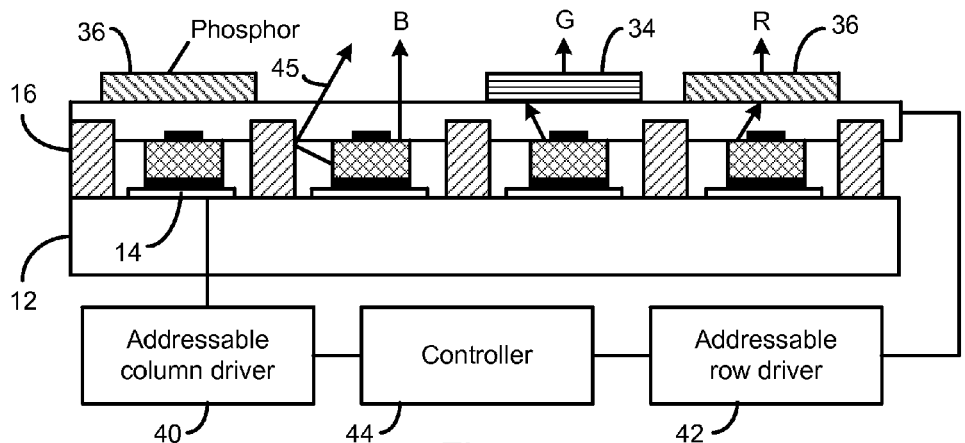
FIG. 7 illustrates deposited red and green phosphor areas over the red and green pixels, assuming all the LEDs emit blue light.

FIG. 7 illustrates how green phosphor dots 34 and red phosphor dots 36 are printed over the blue-emitting LEDs 22 to create green and red pixels. Quantum dots or other wavelength-conversion materials may also be used. FIG. 7 also illustrates conventional addressing and driver circuitry for supplying the required current to any of the pixels to create an image. The addressable column driver 40 and addressable row driver 42 are controlled by a controller 44 to supply the required current to an addressed pixel. The addressing may scan all the pixels in a sequential manner, once per frame, or in any other manner at a high rate to avoid flicker. The blue light (light rays 45) emitted from the LEDs 22 exits directly out of the pixel area or reflects off the walls of the mesh 16 to mix the light within a pixel. Therefore, the display can have a high resolution and high contrast.

Figure 8:
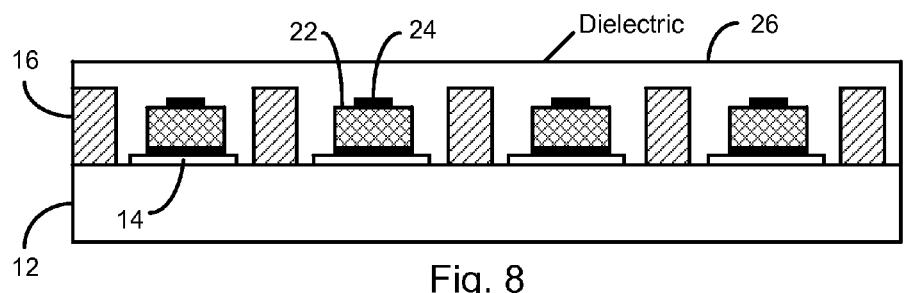
FIG. 8 illustrates another embodiment where a thicker layer of the dielectric material is deposited over the LEDs and mesh.
Figure 9:
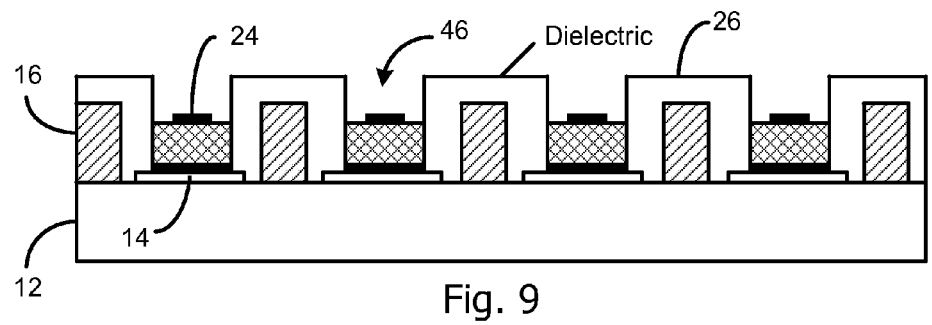
FIG. 9 illustrates openings in the dielectric material formed over the pixel areas to expose the top electrodes of the LEDs.
Figure 10:
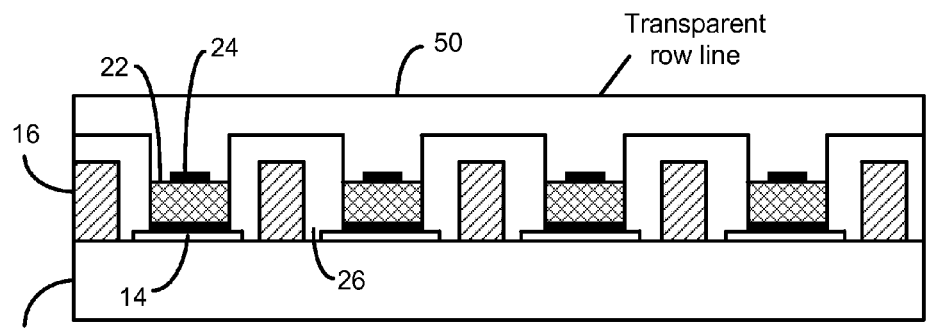
FIG. 10 illustrates a transparent row line deposited so as to contact the top electrodes through the openings.

FIGS. 8-10 illustrate an alternative embodiment for electrically connecting the transparent row lines to the top electrodes 24 of the LEDs 22. In FIG. 8, the dielectric layer 26 does not need to be hydrophobic and can cover the mesh 16.

In FIG. 9, openings 46 are formed in the dielectric layer 26 over each cell sufficient to expose the top electrodes 24. The openings 46 may be formed by a laser (using a mask or by stepping the laser beam), or a wet etch using a mask, or by other means.

In FIG. 10, the transparent row lines 50 are printed to fill the openings 46 and extend across the display.

If the resistivity of the transparent row lines in either embodiment is problematic, such as for a large display, narrow metal conductors may be printed along the edges of the transparent row lines to better spread the current along the row lines yet not block significant light from the pixels.

In another embodiment, the conductors for the LEDs are not formed as row lines and column lines. For example, there may be a dedicated pair of conductors for each pixel area. This allows multiple pixels to be illuminated at the same time.

As seen, the mesh 16 precisely defines the pixels and keeps the LED light within the pixel area, as well as causes all the liquid LED ink to reside only within the cells to form physically isolated areas of the LED ink. Therefore, the pixels can be made very small and defined by the mesh rather than being defined by the screen printing of the LED ink.

Figure 11:
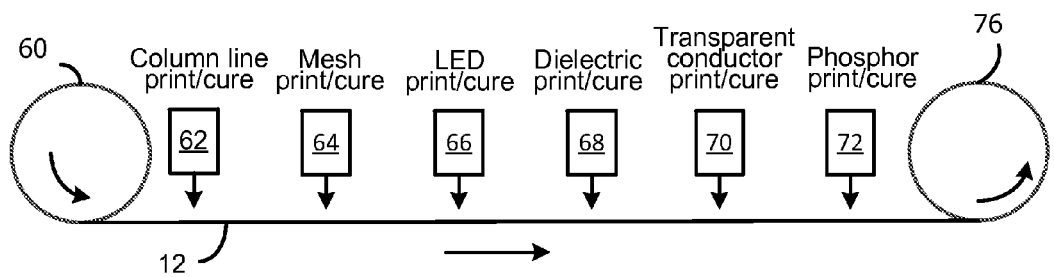
FIG. 11 illustrates a roll-to-roll printing process where the entire color display may be printed under atmospheric conditions.

FIG. 11 schematically illustrates how the entire display of, for example FIG. 7, can be formed under atmospheric conditions, enable the formation of very large displays. Segments of the display may also be formed and then tiled together upon installation. Although the various stations are shown sequentially, the substrate 12 may be stationary, and the various layers may be printed over the stationary substrate 12 using different printing tools and materials.

The substrate 12 is initially supplied on a roll 60. The column lines 14 are printed at station 62 and cured. The mesh 16 is then printed at station 64 and cured. The LED ink 20 is then printed at station 66 and cured. The dielectric layer 26 is then printed at station 68 and cured. The transparent row lines 30 are then printed at station 70 and cured. And, the green and red phosphors 34/36 are then printed at station 72 and cured. The resulting flexible display may then be taken up by a take-up roller 76 or cut into flat sheets.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for fabricating an addressable display comprising:
   forming a plurality of first conductor lines over a substrate;
   forming a mesh over the first conductor lines and the substrate, the mesh having walls defining an array of openings as pixel areas, wherein the first conductor lines are exposed through the openings;
   printing a light emitting diode (LED) ink within the array of openings, the LED ink containing inorganic LED dies having bottom electrodes and top electrodes;
   curing the LED ink such that the bottom electrodes electrically contact the first conductor lines within the pixel areas; and
   forming a plurality of second conductor lines electrically contacting the top electrodes, such that energizing combinations of the first conductor lines and the second conductor lines turns on LEDs within a selected pixel area.

2. The method of claim 1 wherein the mesh is formed of a reflective material.

3. The method of claim 1 wherein the mesh is formed of a material that is hydrophobic with respect to the LED ink so as to repel the LED ink from adhering to top surfaces of the mesh.

4. The method of claim 1 wherein the first conductor lines are column lines and the second conductor lines are row lines.

5. The method of claim 1 wherein the first conductor lines are row lines and the second conductor lines are column lines.

6. The method of claim 1 wherein the LED dies emit blue light, the method further comprising printing wavelength-converting materials overlying some pixel areas to generate a plurality of colors for a color display.

7. The method of claim 1 further comprising depositing a dielectric material within the pixel areas to encapsulate sides of the LED dies.

8. The method of claim 7 further comprising forming holes in the dielectric material over the pixel areas to expose the top electrodes of the LEDs in the pixel areas for contact by the second conductor lines.

9. The method of claim 1 wherein all steps are performed under atmospheric conditions.

10. A display comprising:
a substrate;
a plurality of first conductor lines formed over the substrate;
a mesh formed over the first conductor lines and the substrate, the mesh having walls defining an array of openings as pixel areas, wherein the first conductor lines are exposed through the openings;
printed inorganic LED dies within the array of openings, the LED dies having bottom electrodes and top electrodes, wherein the mesh openings define the locations of the LED dies, and wherein the bottom electrodes electrically contact the first conductor lines within the pixel areas; and
a plurality of second conductor lines electrically contacting the top electrodes, such that energizing combinations of the first conductor lines and the second conductor lines turns on LEDs within a selected pixel area.

11. The display of claim 10 wherein the mesh is formed of a reflective material.

12. The display of claim 10 wherein the mesh is formed of a material that is hydrophobic with respect to the LED ink used to print the LED dies so as to repel the LED ink from adhering to top surfaces of the mesh.

13. The display of claim 10 wherein the first conductor lines are column lines and the second conductor lines are row lines.

14. The display of claim 10 wherein the first conductor lines are row lines and the second conductor lines are column lines.

15. The display of claim 10 wherein the LED dies emit blue light, the display further comprising wavelength-converting materials overlying some pixel areas to generate a plurality of colors for a color display.

16. The display of claim 10 further comprising a dielectric material within the pixel areas encapsulating sides of the LED dies.

17. The display of claim 16 further comprising holes in the dielectric material over the pixel areas to expose the top electrodes of the LEDs in the pixel areas, wherein the second conductor lines electrically contact the top electrodes through the holes.

* * * * *